United States Patent [19]

Bott et al.

[11] 4,322,644

[45] Mar. 30, 1982

[54] CIRCUIT ARRANGEMENT FOR CONTROLLING THE OPERATING FUNCTIONS OF A BROADCAST RECEIVER

[76] Inventors: Friedrich Bott, Prinz-Ludwig-Strasse 21, 8050 Freising; Lembit Soobik, Sonnenstrasse 10, 8051 Kranzberg, both of Fed. Rep. of Germany

[21] Appl. No.: 962,419

[22] Filed: Nov. 20, 1978

[30] Foreign Application Priority Data

Dec. 2, 1977 [DE] Fed. Rep. of Germany ....... 2753863

[51] Int. Cl.³ .................... H03K 5/153; H03K 17/687
[52] U.S. Cl. ................................... 307/571; 307/360; 307/247 A; 307/222 R
[58] Field of Search .............. 307/251, 222 R, 247 A, 307/360; 328/44

[56] References Cited

U.S. PATENT DOCUMENTS

| | | | |
|---|---|---|---|
| 3,054,060 | 9/1962 | Thomason | 307/222 R |
| 3,825,772 | 7/1974 | Ainsworth | 307/247 A |
| 3,899,690 | 8/1975 | Llona et al. | 307/247 A |
| 3,916,327 | 10/1975 | Lampen et al. | 328/44 |
| 4,132,905 | 1/1979 | Stein | 328/44 |

*Primary Examiner*—Stanley D. Miller, Jr.
*Assistant Examiner*—B. P. Davis
*Attorney, Agent, or Firm*—Douglas A. Lashmit; N. Rhys Merrett; Melvin Sharp

[57] ABSTRACT

A circuit arrangement for controlling the operating functions in a device such as a broadcast receiver, including an up/down counter associated with each operating function wherein a particular count corresponds to a certain setting of the operating function. Switch means coupled by a single conductor to the common inputs of two threshold-value circuits provide one of several voltages thereto which cause one or the other or neither of the threshold-value circuits to output a control signal to the up/down center, which in turn counts up, down, or remains at the same count.

4 Claims, 3 Drawing Figures

CIRCUIT ARRANGEMENT FOR CONTROLLING THE OPERATING FUNCTIONS OF A BROADCAST RECEIVER

BACKGROUND OF THE INVENTION

This invention relates to a circuit arrangement for controlling the operating functions, for example, of a broadcast receiver, in which an up/down counter is associated with each operating function, of which the particular count corresponds to a certain setting of the operating function and which comprises an up-counting input and a down-counting input and, in dependence upon function control signals at these inputs, counts pulses supplied by a clock-pulse generator.

In modern broadcast receivers, such as radio broadcast receivers or television broadcast receivers, operating functions, such as volume, brilliance, colour saturation and the like, can be controlled by means of so-called touch keys. For adjusting volume for example, two touch keys are present, one for "louder" and one for "softer". An up/down counter is associated with this "volume" operating function, its particular count corresponding to a certain volume setting. One such counter is also associated with each of the other operating functions. If, in the case of the "volume" operating function for example, the touch key for "louder" is operated, a binary control signal is delivered to the up-counting input of this counter, causing the counter to count clock pulses delivered to it from a clock-pulse generator in the up direction for as long as the touch key is touched. The resulting increase in the count leads to an increase in volume. Conversely, if the touch key for "softer" is touched, a binary control signal is delivered to the down-counting input of the counter, causing the counter to count the clock pulses in the down direction which leads to a reduction in the count and, hence, to a reduction in volume. If neither of the two touch keys is touched, the count remains unchanged so that there is also no change in volume. As can be seen, at least two inputs are required on the up/down counter for controlling the three functions of up-counting, down-counting and standstill.

In order to simplify the structure, it is desirable to accommodate the entire control circuit as far as possible in a single integrated circuit. A major problem in the construction of complicated integrated circuits such as these is that only a limited number of connecting pins is available on the circuit housing. For each up/down counter associated with an operating function, it is necessary to provide one up-counting input and one down-counting input solely for controlling the counting mode of the counter. In view of the relatively large number of operating functions required for a broadcast receiver, this would lead to a large number of connecting pins on the housing of the integrated circuit which would involve considerable costs. In view of the intended application, however, costs such as these are unacceptable.

In addition to or as an alternative to the possibility of controlling the operating functions through touch keys, the operating functions may also be remote-controlled. In this case, the remote-control generator transmits signals which are decoded in the remote-control receiver in the broadcast receiver and produce the same effect as depression of the corresponding touch keys for the required operating function. Accordingly, the above-mentioned problem concerning the number of connecting pins also exists in cases where the operating functions are remote-controlled.

The object of the present invention is to construct a circuit arrangement of the type referred to above in such a way that it may be produced in the form of an integrated circuit at reasonable cost.

SUMMARY OF THE INVENTION

According to the invention, this object is achieved by virtue of the fact that two threshold-value circuits with different threshold values are provided for each operating function, of which the inputs are interconnected whilst their outputs are connected to the up-counting input and to the down-counting input, respectively, of the associated up/down counter and which, in dependence upon the value of a voltage delivered to their inputs, furnish a function control signal having one or the other binary signal value, and by virtue of the fact that the interconnected inputs of the threshold-value circuits are connected to switch means which permit one of several voltage values to be applied to the inputs in accordance with a required setting of the operating function.

In the circuit arrangement according to the invention, only one input is provided for each operating function, to which one of several voltage values may be applied by the switch means. In dependence upon the size of the voltage value, the threshold-value circuits furnish signals having one or the other binary signal value which subsequently pass to the control inputs of the up/down counter and control the counter in such a way as to produce the effect on the count which corresponds to the voltage value applied. Accordingly, the counter may be controlled through a single input in such a way that it counts up, counts down or stands still. Accordingly, by virtue of the construction of the circuit arrangement according to the invention in the form of an integrated circuit, only one connecting pin is required for each operating function. The effect of this saving is of course more favourable, the larger the number of operating functions to be controlled.

Preferably, the switch means comprise two resistors connected in series between the terminals of a feed voltage source, of which the connecting point may be connected by switches either to one or to the other of the feed voltage terminals or to neither, and the connecting point of the resistors is connected to the interconnected inputs of the threshold value circuits. Three different voltage values may be applied by these switch means to the interconnected inputs of the threshold-value circuits which, by delivering corresponding function control signals having one or the other signal values, subsequently produce the required setting of the operating function by initiating the corresponding counting mode of the up/down counter associated with them.

According to the invention, the resistors advantageously consist of MOS field-effect transistors, in each of which the drain electrode is connected to the gate electrode, and said MOS field-effect transistors, together with the threshold-value circuits which also consist of MOS field-effect transistors and the associated up/down counters, are integrated in a single semiconductor circuit.

In one advantageous embodiment of the invention, the threshold value of the first threshold-value circuit is fixed in such a way that the function control signal which it furnishes has a high signal value when the voltage delivered to its input has a low value, and a low signal value when the voltage delivered to its input has a medium or high value, whilst the threshold value of the second threshold-value circuit is fixed in such a way that the function control signal which it furnishes has a low signal value when the voltage delivered to its input has a low or medium value and a high signal value when the voltage delivered to its input has a high value. By virtue of this embodiment of the circuit arrangement according to the invention, it is possible to distinguish three voltages lying in different ranges from one another and to deliver to the up/down counter function control signals which exactly characterise these voltage values so that the required setting of the operating function is obtained.

BRIEF DESCRIPTION OF THE DRAWINGS

The invention will now be explained by way of example with reference to the accompanying drawings, wherein.

DETAILED DESCRIPTION OF THE INVENTION

Figure 1:
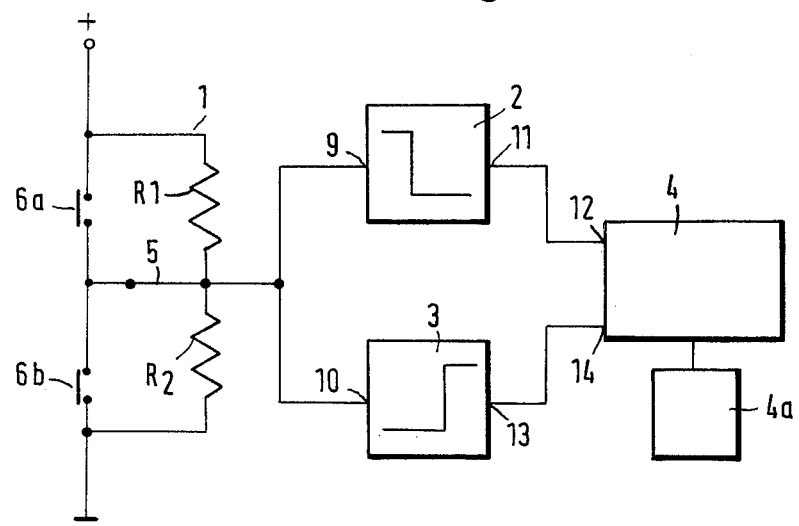
FIG. 1 is a block circuit diagram of a circuit arrangement according to the invention capable of distinguishing between three different voltage values.

The circuit arrangement shown in FIG. 1 comprises a switching device 1, two threshold-value circuits 2, 3 with different threshold values and an up/down counter 4 which is fed with clock pulses from a clock-pulse generator 4a.

By means of the switching device 1, three different voltage values can be produced in one input conductor 5. As can be seen from FIG. 1, the input conductor may be directly applied by means of the switches 6a and 6b on the one hand to the positive terminal 7 of the feed voltage source and, on the other hand, to ground 8. In the inoperative position of the switches 6a and 6b shown in FIG. 1, the input conductor 5 carries a voltage of medium value arising out of the voltage divider consisting of the two resistors R1 and R2 which are connected in series between the terminal 7 and earth 8. The input conductor 5 is connected to the connecting point of the resistors R1 and R2.

The input conductor 5 is also directly connected to the inputs 9 and 10 of the threshold value circuits 2, 3. The output 11 of the threshold-value circuit 2 is connected to the up-counting input 12 of the up/down counter 4, whilst the output 13 of the threshold-value circuit 3 is connected to the down-counting input 14 of the up/down counter 4. As will be explained in more detail, the up/down counter 4 counts the clock pulses delivered to it by the clock-pulse generator 4a in the up or down direction or stands still in dependence upon function control signals at its inputs 12 and 14.

Figure 3:
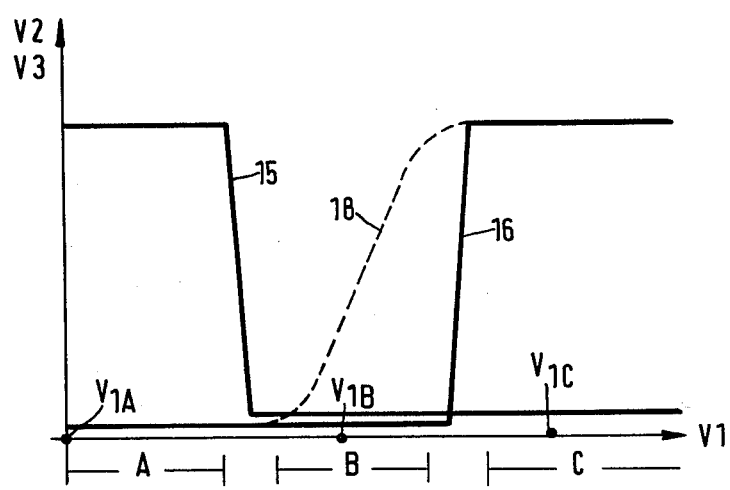
FIG. 3 is a diagram showing the output signals of the threshold-value circuits in dependence upon the voltage applied at the input.

FIG. 3 shows how the threshold-value circuits 2 and 3 behave. The curve 15 represents the waveform of the output voltage V2 of the threshold-value circuit 2 in dependence upon the voltage present at its input 9, whilst the curve 16 represents the waveform of the output voltage V3 of the threshold value circuit 3 in dependence upon the voltage present at its input 10. As can be seen from curve 15, the output voltage V2 of the threshold-value circuit 2 has a high signal value as long as the voltage at the input 9 has a low value lying in the range A. For any higher value of the voltage at the input 9, the output voltage V2 of the threshold value circuit 2 has a low signal value. This applies to all voltage values in the range B and in the range C.

By contrast, the output voltage V3 of the threshold value circuit 3 only has a high signal value when the value of the voltage at its input 10 is also high, i.e. has a value lying in the range C. For values of the voltage at the input 10 in the ranges A and B, the output voltage V3 of the threshold-value circuit 3 has a low signal value.

As already mentioned, three different voltage values may be produced in the input conductor 5 and, hence, at the inputs 9 and 10 of the threshold-value circuits 2 and 3 by means of the switching device 1. The low voltage value $V_{1A}$, which is formed when the input conductor 5 is directly applied to ground through the switch 6b, is therefore the ground value belonging to the range A. The high voltage $V_{1C}$ is produced in the input conductor 5 by virtue of the fact that the input conductor 5 is directly connected to the positive terminal 7 of the feed voltage source through the switch 6a. From this it follows that the feed voltage selected has to be so high that it has a value $V_{1C}$ lying in the range C of FIG. 3. The voltage divider formed by the resistors R1 and R2 has to be dimensioned in such a way that the voltage occurring in the input conductor 5 in the inoperative position of the switches 6a and 6b has a value $V_{1B}$ in the range B.

Accordingly, the three voltage values which can be produced in the input conductor 5 by means of the switching device 1 are converted by the threshold-value circuits 2 and 3 into binary signal values which are unequivocally associated with the particular input voltage value $V_{1A}$, $V_{1B}$, $V_{1C}$. The association is shown in the following Table:

| $V_1$ | $V_2$ | $V_3$ |
|---|---|---|
| $V_{1A}$ | 1 | 0 |
| $V_{1B}$ | 0 | 0 |
| $V_{1C}$ | 0 | 1 |

The binary signal values provide for defined control of the up/down counter 4, i.e. up-counting, down-counting or standstill.

The up/down counter 4 may be constructed for example in the same way as one of the binary counters present in the integrated circuit TMS 3712 manufactured by TEXAS INSTRUMENTS INCORPORATED. This binary counter only counts the clock pulses delivered to it in the up direction when the signal present at its up-counting input has a high signal value, and only counts these pulses in the down direction when the signal present at its down-counting input has a high signal value, retaining its count when neither of its input signals has a high signal value.

Taking the above-described behaviour of the threshold-value circuits into account, it can be seen that the counter counts in the up direction when the input voltage V1 has the ground value $V_{1A}$, the output voltage V2 of the threshold-value circuit having a high value and the output voltage V3 of the threshold-value circuit 3 a low value. If the input voltage V1 has the high value $V_{1C}$, the values of the output voltages V1 and V2 are reversed, so that the counter counts down. When the input voltage V1 has the value $V_{1B}$ lying in the range B, as fixed by the voltage divider resistors R1 and R2, the counter does not change its count. By suitably evaluating and converting the count of the counter, it is possible to obtain the required control of the operating function. For example, volume will increase with up-counting of the counter, decrease with down-counting of the counter and remain unchanged when the counter is stationary.

Figure 2:
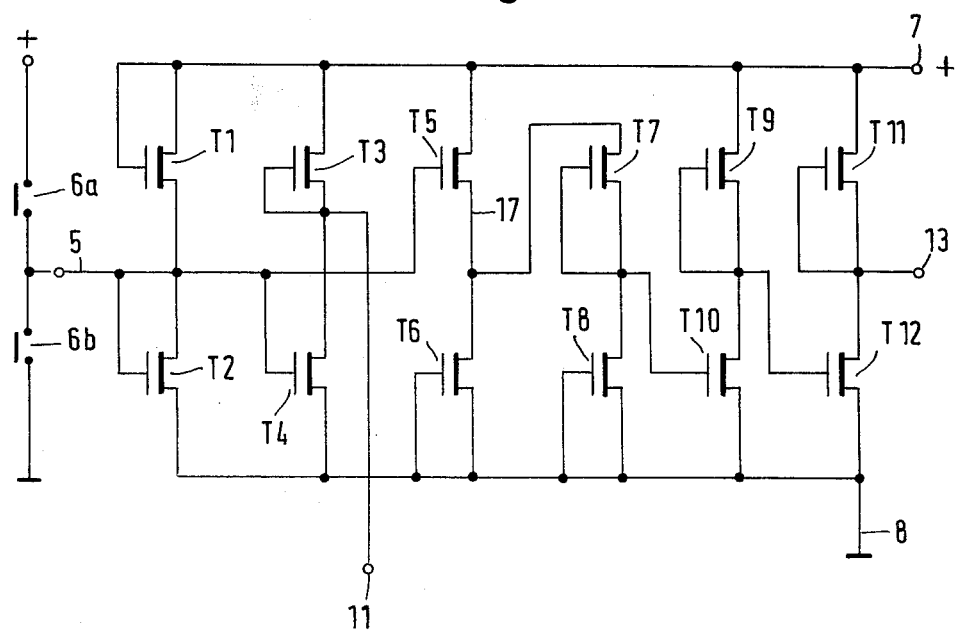
FIG. 2 is a circuit diagram of one possible embodiment of the circuit arrangement according to the invention without the up/down counter.

FIG. 2, in the form of a block circuit diagram, shows how the switching device 1 and the threshold-value circuits 2 and 3 can be formed using only MOS field-effect transistors. In this circuit, the resistor R1 of the switching device 1 is formed by the transistor T1 and the resistor R2 by the transistor T2. As in the case of the switching device 1 shown in FIG. 1, the input conductor 5 may be connected through switches 6a and 6b to the positive terminal of the feed voltage source or to ground. In the circuit shown in FIG. 2, the threshold-value circuit 2 is formed by the transistors T3 and T4 and the threshold-value circuit 3 by the transistors T5 to T12.

The circuit described thus far behaves as follows: when the input conductor 5 is applied to ground 8, ground potential is applied to the gate electrode of the transistor T4, so that this transistor is blocked. Accordingly, no current can flow through the transistor T3 acting as a resistor, so that a high voltage value occurs at the output 11.

At the same time, the voltage value in the input conductor 5 is applied to the gate electrode of the transistor T5 so that this transistor is also blocked.

This transistor T5 is only conductive when the input voltage of high value $V_{1C}$ lying in the range C is applied to its gate electrode by the input conductor 5. Accordingly, the transistor T5 only conducts at a higher input voltage value than the transistor T4. This higher threshold value of the threshold-value circuit formed by the transistors T5 and T6 arises out of the fact that the source electrode 17 of the transistor T5 is not connected to ground 8 directly, but instead through the drain-source path of the transistor T6 acting as a resistor. Accordingly, the transistor T5 can only conduct when the input voltage is higher than its own threshold voltage plus the threshold voltage of the transistor T6.

In FIG. 3, the curve 18 represents the waveform of the voltage at the source electrode of the transistor T5 if the voltage at its gate electrode were to be continuously increased from 0 to a value in the range C. As curve 18 shows, the voltage range in which the output voltage at the output 11 and at the source electrode of the transistor T5 has a low value, is very narrow. However, this is unfavourable for the reliable and clear differentiation of the required input voltage ranges A, B and C. For this reason, the source voltage of the transistor T5 is not directly used as the output voltage of the threshold-value circuit 3, but instead is first shaped in further stages containing the transistors T7 to T12 in such a way that it finally assumes the waveform represented by curve 16 in FIG. 3 at the output 13. Accordingly, the sole function of these transistors T7 to T12 is to make the transition of the output voltage V3 from the low value to the high value steeper.

The circuit arrangement shown in FIG. 2 is formed exclusively by MOS field-effect transistors. It may readily be produced in the form of an integrated circuit together with the associated up/down counter and other such circuit arrangements with the counters for other operating functions and a clock-pulse generator common to all the counters. By means of the circuit arrangement shown in FIG. 2, it is possible to produce at the outputs 11 and 13 signals of which the respective binary values are strictly associated with one of three input voltage values applied to the input conductor 5. Accordingly, it is possible to control an up/down counter, which for the purposes of exact control has to receive function control signals at two inputs, by applying one of three voltage values to one conductor. As already mentioned, the up/down counter of each operating function may therefore be controlled through a single connecting pin of the integrated circuit which corresponds to the input conductor 5 in FIG. 2.

We claim:

1. A circuit arrangement for controlling the operating functions of a device, in which an up/down counter is associated with each operating function, of which the particular count corresponds to a certain setting of the operating function and which comprises an up-counting input and a down-counting input and, in dependence upon function control signals at these inputs, counts pulses supplied by a clock-pulse generator, wherein two threshold-value circuits each having an input, an output and different threshold values are provided for each operating function, said threshold-value circuit inputs being coupled together and said threshold-value circuit outputs being connected to the up-counting input and to the down-counting input, respectively, of the associated up-down counter, and wherein in dependence upon the value of a voltage delivered to their interconnected inputs, each of said threshold-value circuits furnishes a function control signal having one or the other binary signal value, and wherein further the interconnected inputs of the threshold-value circuits are connected to switch means which permit one of several voltage values to be applied thereto in accordance with a required setting of the operating function, whereby only a single conductor from said switch means to said threshold-value circuits is required to control each of said operating functions.

2. A circuit arrangement as claimed in claim 1, wherein the switch means comprises two resistors which are connected in series between the terminals of a feed voltage source and of which the connecting point may be connected by switches to one or to the other of the feed voltage terminals or to neither, and wherein the connecting point of the resistors is connected to the interconnected inputs of the threshold-value circuits.

3. A circuit arrangement as claimed in claim 2, wherein the resistors consist of MOS field-effect transistors in each of which the drain electrode is connected to the gate electrode, and wherein said MOS field-effect transistors, together with the threshold-value circuits, which also consist of MOS field-effect transistors, and the associated up/down counters are integrated in a single semiconductor circuit.

4. A circuit arrangement as claimed in claim 1, wherein the threshold value of the first threshold-value circuit is fixed in such a way that the function control signal which it furnishes has a high signal value when the voltage delivered to its input has a low value, and a low signal value when the voltage delivered to its input has a medium or a high value, and wherein the threshold value of the second threshold-value circuit is fixed in such a way that the function control signal which it furnishes has a low signal value when the voltage delivered to its input has a low or a medium value and a high signal value when the voltage delivered to its input has a high value.

* * * * *